(12) United States Patent
Yu et al.

(10) Patent No.: US 6,501,186 B1
(45) Date of Patent: Dec. 31, 2002

(54) BOND PAD HAVING VARIABLE DENSITY VIA SUPPORT AND METHOD FOR FABRICATION

(75) Inventors: Chen-Hua Yu, Hsin-Chu (TW); Tsu Shih, Hsin-Chu (TW)

(73) Assignee: Taiwan Semiconductor Manufacturing Company, Ltd, Hsin Chu (TW)

( * ) Notice: Subject to any disclaimer, the term of this patent is extended or adjusted under 35 U.S.C. 154(b) by 0 days.

(21) Appl. No.: 09/915,035

(22) Filed: Jul. 25, 2001

(51) Int. Cl.⁷ .......................... H01L 23/48; H01L 23/52; H01L 29/40
(52) U.S. Cl. ....................... 257/786; 257/774; 257/775; 257/758; 257/748
(58) Field of Search ................................ 257/734, 774, 257/775, 758, 748, 786; 438/612, 637, 638

(56) References Cited

U.S. PATENT DOCUMENTS 6,232,662 B1 * 5/2001 Saran ........................ 257/734
6,239,494 B1 * 5/2001 Besser et al. ................ 257/700
6,313,537 B1 * 11/2001 Lee et al. .................... 257/680
2001/0010407 A1 * 8/2001 Ker et al. .................... 257/781

* cited by examiner

Primary Examiner—Chandra Chaudhari
Assistant Examiner—Timothy Sutton
(74) Attorney, Agent, or Firm—Tung & Associates

(57) ABSTRACT

A bond pad structure that is supported by a multiplicity of vias arranged in at least two regions each having a different via density than the other and a method for forming the structure are described. The structure includes a layer of an insulating material such as a low-k dielectric, a first multiplicity of vias formed in a center region of the low-k dielectric material that has a first density, a second multiplicity of vias formed in a peripheral region of the low-k dielectric material surrounding the center region that has a second density, wherein the second density is higher than the first density. A conductive metal pad of generally rectangular shape is then formed on top of and electrically connected to the first and second multiplicity of vias.

15 Claims, 2 Drawing Sheets

1:1

1:3

BOND PAD HAVING VARIABLE DENSITY VIA SUPPORT AND METHOD FOR FABRICATION

FIELD OF THE INVENTION

The present invention generally relates to a bond pad structure on an integrated circuit chip and more particularly, relates to a bond pad structure on an integrated circuit chip that is supported by a multiplicity of vias arranged in at least two regions each having a density different from the other.

BACKGROUND OF THE INVENTION

In the fabrication of semiconductor devices, an integrated circuit chip is assembled in a package during a final process step to complete the fabrication process. The package is then connected to a printed circuit board as part of a large circuit. To establish electrical communication with the integrated circuit chip, a wire bonding process can be used to connect a multiplicity of bond pads situated on the integrated circuit chip to the printed circuit board.

In a typical IC chip, active circuit elements such as transistors, resistors, etc., are formed in the central portion, i.e. the active region, of the chip while bond pads are normally arranged around the periphery of the active region such that active circuit elements are less likely to be damaged during a subsequent bonding process. When a wire bonding process is performed on a bond pad on an IC chip, the process entails the bonding of a gold or aluminum wire to the bond pad by fusing the two together with ultrasonic energy. The wire is then pulled away from the bond pad after the bond is formed. During the bonding of the gold wire to the pad and the pulling away of the wire from the pad, high mechanical stress is placed on the bond pad. When the bond pads are not properly formed, defects such as delamination from the underlying substrate have been encountered.

The delamination, or otherwise known as bond pad lift-off, occurs due to the fact that during the attachment process of a gold wire to a bond pad, a high level of mechanical stress is placed on the pad. It is also caused by the fact that a relatively large, heavy bond is placed on top of layers which may not have strong adhesion to the underlying layers. For instance, one factor that affects adhesion between the layers is the usage of a diffusion barrier layer formed of a material such as TiN for preventing aluminum diffusion into underlying conductive layers during subsequent high temperature processes. The diffusion barrier layer utilized, i.e., TiN, TiW or other alloys, does not have strong adhesion to the underlying oxide layer in the bond pad. This is one example of how the bond pad lift-off defect can occur.

Other processing parameters may also cause bond pad lift-off or delamination problem in semiconductor devices. For instance, low dielectric constant (low-k) materials have been used in recently developed semiconductor devices which causes adhesion problems between these low-k dielectric materials and the underlying oxide layers. The adhesion of these low-k dielectric materials, or inter-metal-dielectric (IMD) materials to oxide is poorer than that between oxide and oxide. However, the use of low-k dielectric materials, such as HSQ (hydrogen silsesquioxane) and MSQ (methyl silsesquioxane) is desirable in high performance semiconductor structures since thinner layers of the materials may be used as insulating layers due to their low-k characteristics. Another drawback of these low-k dielectric materials is their low thermal conductivity when compared to that of regular oxide. During a chip bonding process, the local temperature around a bond pad is significantly higher due to the poor thermal conductivity of the low-k dielectric material. The thermal stress caused by the poor thermal conductivity of IMD, in addition to the mechanical stresses caused by the bonding operation, may cause delamination of a low-k IMD layer from its underlying oxide layer.

In modern semiconductor devices that are designed specifically for high speed operation or for use in radio frequency circuits, it becomes highly desirable to use a single metal layer as the bond pad. The elimination of lower metal layers results in a smaller parasitic capacitance which is essential for such applications. In single metal layer bond pad applications, the pig bond pad lift-off defect becomes more severe due to poor adhesion of the single metal layer with the underlying dielectric layer. The single metal layer deposited on a dielectric layer no longer has the beneficial anchoring effect achieved in multiple metal layers. This is shown in FIGS. 1A, 1B and 1C.

FIG. 1A is an enlarged, cross-sectional view of a semiconductor device 10 formed with a bond pad 12 that has a multi-level metal structure. The bond pad 12 is constructed by four individual metal layers 14 connected therein between by a plurality of vias 16. The bond pad 12 is formed in a dielectric material layer 18 that is pre-deposited on a silicon substrate 20. The bond pad 12 is further covered along its edges by a passivation material layer 22.

As shown in FIG. 1A, the bond pad 12 is firmly anchored in the dielectric layer 18 by the multiple metal layers 14 which are interconnected by the plurality of vias 16. The adhesion between the bond pad 12 and the dielectric layer 18 is sufficiently strong for conducting a wire pull test or a ball shear test, shown in FIG. 1C.

On the other hand, in the single metal layer bond pad structure 24 shown in FIG. 1B for the semiconductor structure 30, the adhesion between the metal layer 26, the vias 16 and the dielectric layer 28, without the anchoring effect of the other metal layers, is weak. As a result, the bond pad structure 24 can not survive a wire pull bond test without delaminating from the dielectric layer 28. Furthermore, the single metal bond pad 24 may not survive a wire bonding process without the bond pad lift-off defect.

Others have attempted to solve the poor bondability problem of a bond pad on a low-k dielectric material layer by increasing the density, i.e. or the pitch, defined as the ratio between the diameter of the via and the spacing between the vias. The larger number of vias improves thermal conduction, or heat dissipation of the bond pad and furthermore, improves the mechanical strength of the bond pad due to the anchoring capability of the vias. This is shown in FIGS. 2A and 2B.

FIG. 2A illustrates a conventional method for increasing the pitch, or density, of vias 16 under a bond pad 24 from that shown in FIG. 2B wherein the vias 16 have a pitch of 1:3. However, while gaining the thermal conductivity, heat dissipation properties, and the mechanical bond strength due to the larger number of vias 16, the high density via used for bond pad 24 causes other processing problems. For instance, when the number of vias, and thus via openings, greatly increases, i.e. to a pitch of 1:1, the via openings may be etched through and connected to other via openings. As a result, there is no insulating oxide or low-k dielectric material left in-between the via openings. The process for laying out and forming via openings that are densely placed together further adds complexity to the fabrication process.

It is therefore an object of the present invention to provide a bond pad structure supported by a multiplicity of vias that does not have the drawbacks or shortcomings of the conventional bond pad structures.

It is another object of the present invention to provide a bond pad structure that is supported by a multiplicity of vias arranged in at least two regions each having a density that is different from the other.

It is a further object of the present invention to provide a bond pad structure that is supported by a multiplicity of vias arranged in at least three regions each having a density that is different from the other regions.

It is another further object of the present invention to provide a bond pad structure that is supported by a multiplicity of vias arranged in at least two regions wherein a via density in one region is at least two times the via density in the other region.

It is still another object of the present invention to provide a method for forming a bond pad structure that is supported by vias arranged in regions of different densities.

It is yet another object of the present invention to provide a method for forming a bond pad structure on top of a low-k dielectric material layer that is supported by a multiplicity of vias formed of Cu.

SUMMARY OF THE INVENTION

In accordance with the present invention, a bond pad structure that is supported by a multiplicity of vias arranged in at least two regions each having a via density different from the other, is provided.

In a preferred embodiment, a bond structure that is supported by a multiplicity of vias arranged in at least two regions each having a via density different than the other is provided which includes a layer of an insulating material; a first multiplicity of vias formed in a center region of the layer of insulating material having a first density; a second multiplicity of vias formed in a peripheral region of the layer of insulating material surrounding the center region that has a second density; and a conductive metal pad of generally rectangular shape that is formed on top of and connect to the first and second multiplicity of vias.

In the bond pad structure, the second density is at least two times of the first density, or the second density is about three times of the first density. The bond pad may further include a third multiplicity of vias formed in an outer peripheral region of the layer of insulating material surrounding the peripheral region that has a third density. The third density is at least two times of the second density. The layer of insulating material is formed of a dielectric material, such as silicon oxide or a low-k material that has a dielectric constant smaller than 4.0. The first and second multiplicity of vias may be formed of Cu. The first multiplicity of vias can be formed with a pitch larger than 1:2, while the second multiplicity of vias may be formed with a pitch smaller than 1:2.

The present invention is further directed to a method for forming a bond pad structure that is supported by vias arranged in regions of different via densities which can be carried out by the steps of first providing a pre-processed electronic substrate; then depositing an insulating material layer on the pre-processed electronic substrate; then forming a first multiplicity of via openings that has a first pitch in the insulating material layer; then forming a second multiplicity of via openings that has a second pitch surrounding the first multiplicity of via openings in the insulating material layer; filling the first and second multiplicity of via openings with a conductive metal forming a first and second multiplicity of vias; and forming a conductive metal pad on top of and connected to the first and second multiplicity of vias.

The method for forming a bond pad structure that is supported by vias arranged in regions of different densities may further include the step of depositing the insulating material layer from a material that has a dielectric constant smaller than 4.0. The method may further include the step of filling the first and second multiplicity of via openings with Cu. The method may further include the step of forming the conductive metal pad with Al. The second pitch is larger than the first pitch, or the second pitch is at least two times of the first pitch.

The present invention is still further directed to a bond pad structure that is supported by a multiplicity of vias arranged in at least three regions each having a via density different than the others which includes a layer of an insulating material; a first multiplicity of vias that are formed in a center region of the layer of insulating material that has a first density; a second multiplicity of vias formed in an inner peripheral region of the layer of insulating material surrounding the center region which has a second density; a third multiplicity of vias formed in an outer peripheral region of the layer of insulating material surrounding the inner peripheral region and has a third density; and a conductive metal pad of generally rectangular shape that is formed on top of and connect to the first and second multiplicity of vias.

In the bond pad structure that is supported by a multiplicity of vias arranged in at least three regions, the second density is larger than the first density, while the third density is larger than the second density. The layer of insulating material may have a dielectric constant smaller than 4.0. The first, second and third multiplicity of vias may be formed of Cu.

BRIEF DESCRIPTION OF THE DRAWINGS

These and other objects, features and advantages of the present invention will become apparent from the following detailed description and the appended drawings in which.

DETAILED DESCRIPTION OF THE PREFERRED EMBODIMENT

Figure 1A:
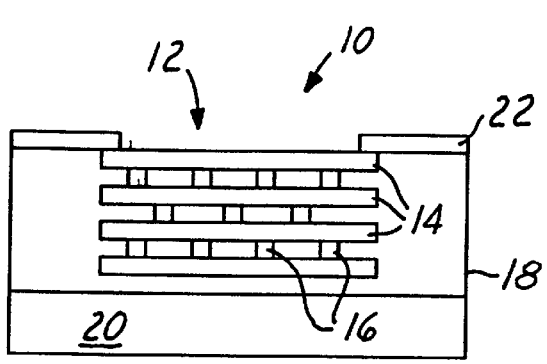
FIG. 1A is an enlarged, cross-sectional view of a conventional bond pad structure formed with multiple levels of metals and vias.
Figure 1B:
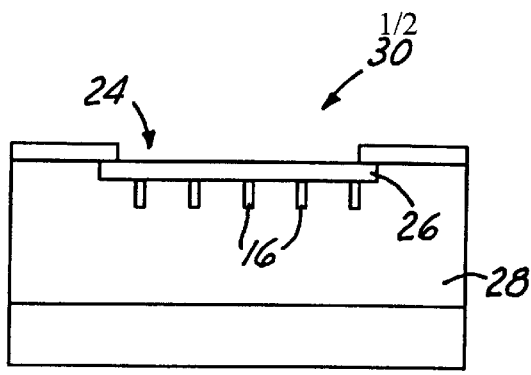
FIG. 1B is an enlarged, cross-sectional view of a conventional bond pad structure showing a single metal pad layer with a multiplicity of vias.
Figure 1C:
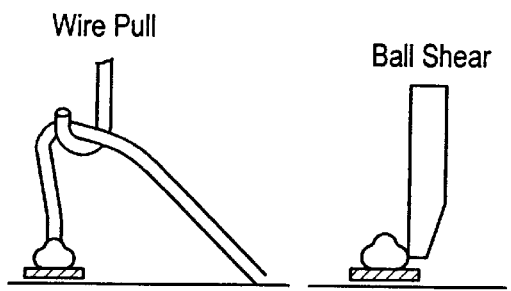
FIG. 1C is a graph illustrating different mechanical test for bond pad strength.
Figure 2A:
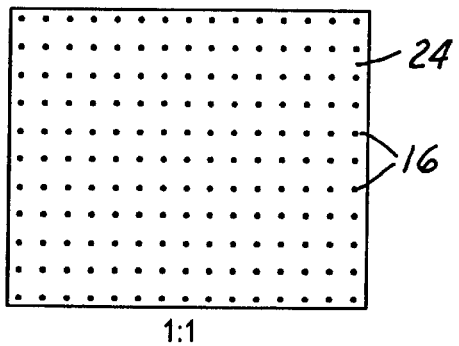
FIG. 2A is a plane view of a conventional bond pad with a high density of vias formed under the pad.
Figure 2B:
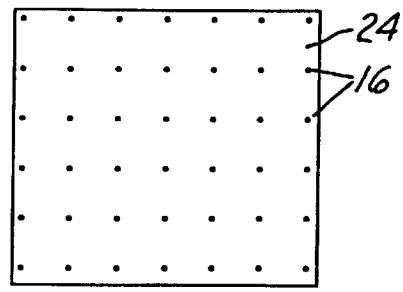
FIG. 2B is a plane view of a conventional bond pad with a low density of vias formed under the pad.

The present invention discloses a bond pad that has variable density via support and a method for fabricating the pad.

In the bond pad that has variable density via support, the pad is supported by a multiplicity of vias arranged in at least two regions each having a via density that is different from the other. For instance, in a center region of the bond pad, a via density, as indicated by a pitch of 1:3, is formed which is surrounded by a peripheral regions that has a high via density as indicated by a pitch of 1:1. The first multiplicity of vias formed in the center region and the second multiplicity of vias formed in a peripheral region are both formed by filling a conductive metal, such as copper, into via openings that are formed in a low-k dielectric material. The softer nature of the copper material and the low-k dielectric material leads to a bondability problem for the bond pad formed on top. The bond pad is normally formed of a conductive metal such as aluminum.

In the two regions each having a different via density than the other, the via density in the peripheral region is at least two times higher than that in the center region. Preferably, the via density in the peripheral region should be about three times higher than the via density in the center region.

The present invention further discloses a method for forming a bond pad structure supported by vias that are arranged in regions of different via densities. The method can be carried out by first providing a pre-processed electronic substrate and then depositing an insulating material layer, i.e. such as a low-k dielectric material, on the pre-processed electronic substrate. A first multiplicity of via openings that have a first pitch is then formed in the insulating material layer, followed by the formation of a second multiplicity of via openings that have a second pitch surrounding the first multiplicity of via openings in the insulating material layer. The first and the second multiplicity of via openings are then filled with a conductive metal to form a first and second multiplicity of vias. A suitable conductive metal is copper. A conductive metal such as aluminum is then formed into a bond pad on top of and electrically connected to the first and second multiplicity of vias.

The present invention is still further directed to a bond pad structure that is supported by a multiplicity of vias arranged in at least three regions each having a different via density than the other two regions. For instance, a first multiplicity of vias may be formed in a center region having a first, highest via density. A second multiplicity of vias can be formed in an inner peripheral region surrounding the center region that has a second, or medium via density. A third multiplicity of vias is then formed in an outer peripheral region in the low-k dielectric material surrounding the inner peripheral region in a third, lowest via density.

By utilizing the present invention novel structure of a variable density via support, a bond pad that has substantially improved bondability with the low-k dielectric material and the copper vias can be provided. The present invention bond pad has improved thermal dissipation and heat transfer, and furthermore, improved stress distribution and mechanical bond strength.

Figure 3:
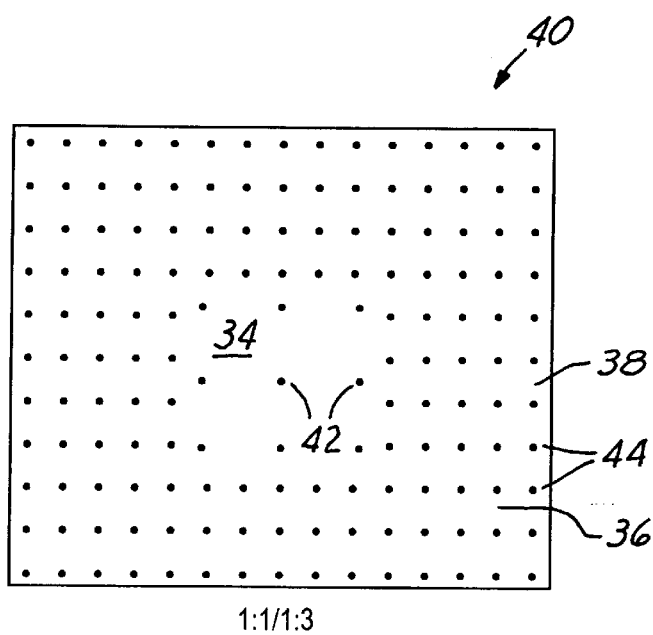
FIG. 3 is a plane view of the present invention bond pad structure supported by a multiplicity of vias arranged in two regions each having a different via density.

Referring now to FIG. 3, wherein a present invention bond pad 40 is shown in a plane view prior to the deposition of the bond pad metal. A first multiplicity of vias 42 is formed in a center region of a layer of insulating material 38 that has a first via density, i.e. a pitch of 1:3. For instance, when the diameter of the via is 0.25 μm, the distance between the vias is about 0.75 μm. The pitch is then calculated as 0.25 μm/0.75 μm=1:3.

In the present invention composite via structure shown in FIG. 3, a second multiplicity of vias 44 is formed in a peripheral region 36 of the layer of insulating material layer 38 surrounding the center region 34. The second multiplicity of vias 44 is formed with a density, i.e. a pitch of 1:1. It should be noted that the vias 44,42 shown in FIG. 3 are for illustration purposes only and therefore are not drawn to scale.

Figure 4:
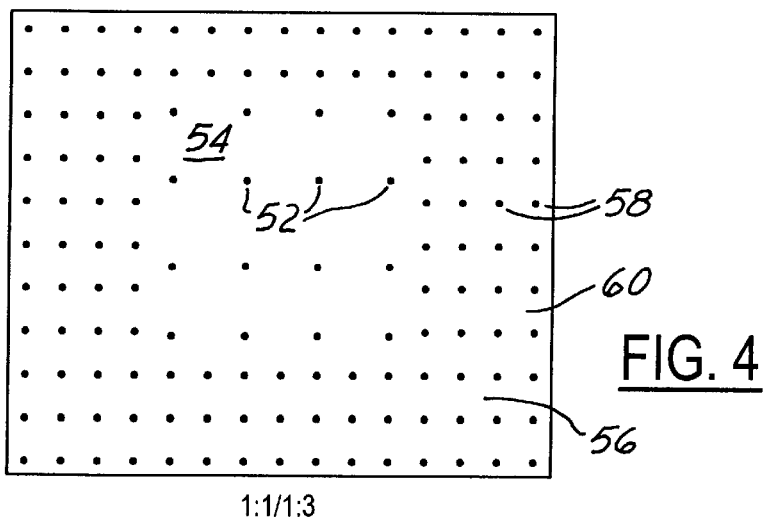
FIG. 4 is a plane view of a present invention bond pad structure supported by a multiplicity of vias arranged in two regions each having a different via density.
Figure 5:
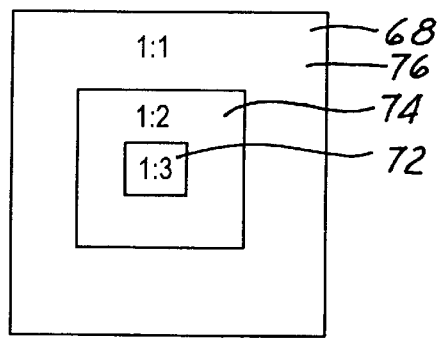
FIG. 5 is an illustration of a present invention bond pad structure that is supported by a multiplicity of vias arranged in three regions each having a different via density.

In another preferred embodiment, the present invention bond pad structure 50 is provided which has an enlarged center region 54 and a reduced peripheral region 56 formed in an insulating material 60. The first plurality of vias 52 is formed in the center region 54 with a low via density, or a pitch of 1:3. In the peripheral region 56, the vias 58 are formed with a higher density, or a pitch of 1:1. When compared to the embodiment shown in FIG. 3, the center region 54 shown in FIG. 4, is larger than the center region 34 shown in FIG. 3. Similarly, FIG. 5 illustrates two peripheral regions of an inner peripheral region 74 and an outer peripheral region 76, and a center region 72 formed in an insulating material 68. Each of the three regions 72,74 and 76 have a via density of 1:3, 1:2 and 1:1, respectively.

The present invention novel bond pad structure that is supported by a multiplicity of vias arranged in at least two regions each having a different via density than the other and a method for forming the bond pad structure have therefore been amply described in the above description and in the appended drawings of FIGS. 3, 4 and 5.

While the present invention has been described in an illustrative manner, it should be understood that the terminology used is intended to be in a nature of words of description rather than of limitation.

Furthermore, while the present invention has been described in terms of three preferred embodiments, it is to be appreciated that those skilled in the art will readily apply these teachings to other possible variations of the inventions.

The embodiment of the invention in which an exclusive poperty or privilege is claimed are defined as follows.

What is claimed is:

1. A bond pad structure supported by a multiplicity of vias arranged in at least two regions each having a via density different than the others comprising:
   a layer of an insulating material;
   a first multiplicity of vias formed in a center region of said layer of insulating material having a first density;
   a second multiplicity of vias formed in a peripheral region of said layer of insulating material surrounding said center region having a second density, said second density being different than said first density; and
   a conductive metal pad of generally rectangular shape formed on top of and connected to said first and second multiplicity of vias.

2. A bond pad structure supported by a multiplicity of vias arranged in at least two regions each having a via density different than the others according to claim 1, wherein said second density is at least two times of said first density.

3. A bond pad structure supported by a multiplicity of vias arranged in at least two regions each having a via density different than the others according to claim 1, wherein said second density is about three times of said first density.

4. A bond pad structure supported by a multiplicity of vias arranged in at least two regions each having a via density different than the others according to claim 1 further comprising a third multiplicity of vias formed on an outer peripheral region of said layer of insulating material surrounding said peripheral region having a third density.

5. A bond pad structure supported by a multiplicity of vias arranged in at least two regions each having a via density different than the others according to claim 4, wherein said third density is at least two times of said second density.

6. A bond pad structure supported by a multiplicity of vias arranged in at least two regions each having a via density different than the others according to claim 1, wherein said layer of insulating material is formed of a dielectric material.

7. A bond pad structure supported by a multiplicity of vias arranged in at least two regions each having a via density different than the others according to claim 1, wherein said layer of insulating material is formed of silicon oxide.

8. A bond pad structure supported by a multiplicity of vias arranged in at least two regions each having a via density different than the others according to claim 1, wherein said layer of insulating material is formed of a material having a dielectric constant smaller than 4.0.

9. A bond pad structure supported by a multiplicity of vias arranged in at least two regions each having a via density different than the others according to claim 1, wherein said first and second multiplicity of vias are formed of Cu.

10. A bond pad structure supported by a multiplicity of vias arranged in at least two regions each having a via density different than the others according to claim 1, wherein said first multiplicity of vias is formed with a pitch larger than 1:2.

11. A bond pad structure supported by a multiplicity of vias arranged in at least two regions each having a via density different than the others according to claim 1, wherein said second multiplicity of vias is formed with a pitch smaller than 1:2.

12. A bond pad structure supported by a multiplicity of vias arranged in at least three regions each having a via density different than the others comprising:

a layer of an insulating material;

a first multiplicity of vias formed in a center region of said layer of insulating material having a first density;

a second multiplicity of vias formed in an inner peripheral region of said layer of insulating material surrounding said center region having a second density, said second density being different than said first density;

a third multiplicity of vias formed in an outer peripheral regions of said layer of insulating material surrounding said inner peripheral region having a third density, said third density being different than said second density; and a conductive metal pad of generally rectangular shape formed on top of and connected to said first, said second and said third multiplicity of vias.

13. A bond pad structure supported by a multiplicity of vias arranged in at least three regions each having a via density different than the others according to claim 12, wherein said second density is larger than said first density, and said third density is larger than said second density.

14. A bond pad structure supported by a multiplicity of vias arranged in at least three regions each having a via density different than the others according to claim 12, wherein said layer of insulating material has a dielectric constant smaller than 4.0.

15. A bond pad structure supported by a multiplicity of vias arranged in at least three regions each having a via density different than the others according to claim 12, wherein said first, second and third multiplicity of vias are formed of Cu.

\* \* \* \* \*